(12) United States Patent
Mizutani

(10) Patent No.: US 9,030,007 B2
(45) Date of Patent: May 12, 2015

(54) SEMICONDUCTOR DEVICE AND MANUFACTURING METHOD THEREOF

(75) Inventor: Daisuke Mizutani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 429 days.

(21) Appl. No.: 12/903,403

(22) Filed: Oct. 13, 2010

(65) Prior Publication Data

US 2011/0084383 A1   Apr. 14, 2011

(30) Foreign Application Priority Data

Oct. 14, 2009  (JP) .................................. 2009-237377
Aug. 27, 2010  (JP) .................................. 2010-190604

(51) Int. Cl.
| H01L 23/48 | (2006.01) |
| H05K 1/14 | (2006.01) |
| H05K 3/34 | (2006.01) |
| H05K 3/36 | (2006.01) |
| H01L 21/768 | (2006.01) |

(Continued)

(52) U.S. Cl.
CPC .......... *H05K 1/147* (2013.01); *H01L 21/76898* (2013.01); *H05K 1/0218* (2013.01); *H05K 1/141* (2013.01); *H05K 3/222* (2013.01); *H05K 3/3436* (2013.01); *H05K 3/363* (2013.01); *H05K 2201/0379* (2013.01); *H05K 2201/0715* (2013.01); *H05K 2201/09063* (2013.01); *H05K 2201/092* (2013.01); *H05K 2201/10666* (2013.01); *H05K 2201/10734* (2013.01); *H05K 2203/167* (2013.01); *H01L 2224/16225* (2013.01); *H01L 2224/32225* (2013.01); *H01L 2224/73204* (2013.01); *H01L 2924/15311* (2013.01)

(58) Field of Classification Search
USPC .......................................... 257/737; 438/121
See application file for complete search history.

(56) References Cited

U.S. PATENT DOCUMENTS 5,367,435 A * 11/1994 Andros et al. ................ 361/749
2007/0096311 A1* 5/2007 Humpston et al. ........... 257/734

(Continued)

FOREIGN PATENT DOCUMENTS

| JP | 04-082244 | 3/1992 |
| JP | 05-160199 A | 6/1993 |
| JP | 7-183333 | 7/1995 |

(Continued)

OTHER PUBLICATIONS

Chinese Office Action mailed Oct. 17, 2012, in the corresponding Chinese patent application No. 201010510337.9, with English translation.

(Continued)

*Primary Examiner* — Fernando L Toledo
*Assistant Examiner* — Valerie N Newton
(74) *Attorney, Agent, or Firm* — Kratz, Quintos & Hanson, LLP

(57) ABSTRACT

A semiconductor device includes a first circuit base member including a surface having multiple first electrodes formed thereon, a second circuit base member being provided above the first circuit base member and having first through holes and second through holes formed respectively above the first electrodes, a semiconductor package provided above the second circuit base member, and multiple first bumps provided inside the first through holes and the second through holes to connect the first electrodes to the semiconductor package.

13 Claims, 19 Drawing Sheets

(51) Int. Cl.
*H05K 1/02* (2006.01)
*H05K 3/22* (2006.01)

(56) References Cited

U.S. PATENT DOCUMENTS

2008/0157361 A1* 7/2008 Wood et al. .................. 257/738
2008/0197492 A1* 8/2008 Mizutani ...................... 257/737

FOREIGN PATENT DOCUMENTS

| JP | 2837521 | B2 | 10/1998 |
| JP | 11-163044 | | 6/1999 |
| JP | 2003-152322 | | 5/2003 |
| JP | 2005-347513 | A | 12/2005 |
| JP | 2006-351935 | | 12/2006 |
| JP | 2007-27305 | A1 | 2/2007 |
| JP | 2008-283109 | | 11/2008 |

OTHER PUBLICATIONS

Japanese Office Action issued for Japanese Patent Application No. 2010-190604 dated Dec. 24, 2013.
Office Action of Japan Patent Application 2014-031543 dated Jan. 20, 2015. Translation of the opinion part of the examiner on references rejection of the Office Action.

* cited by examiner

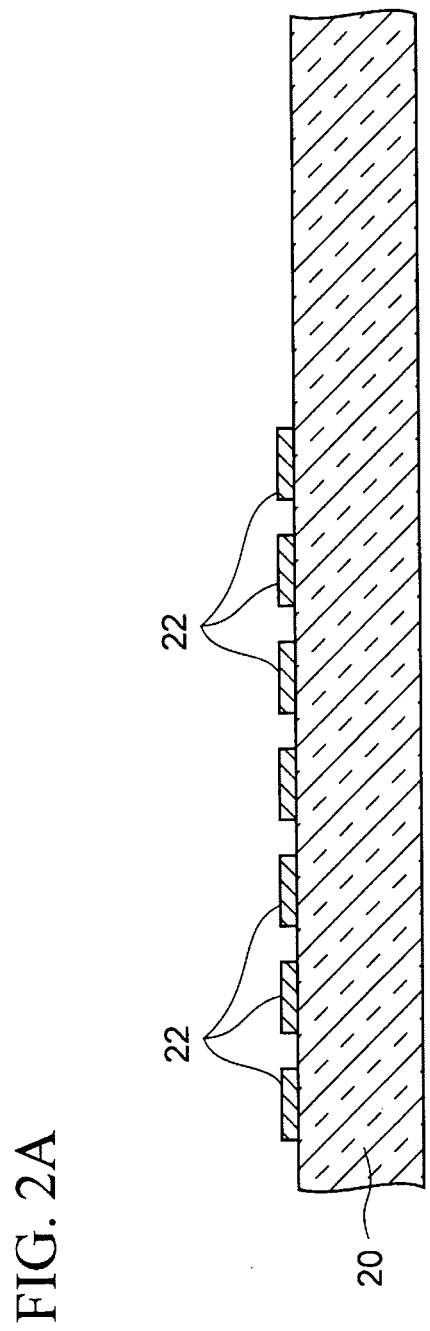

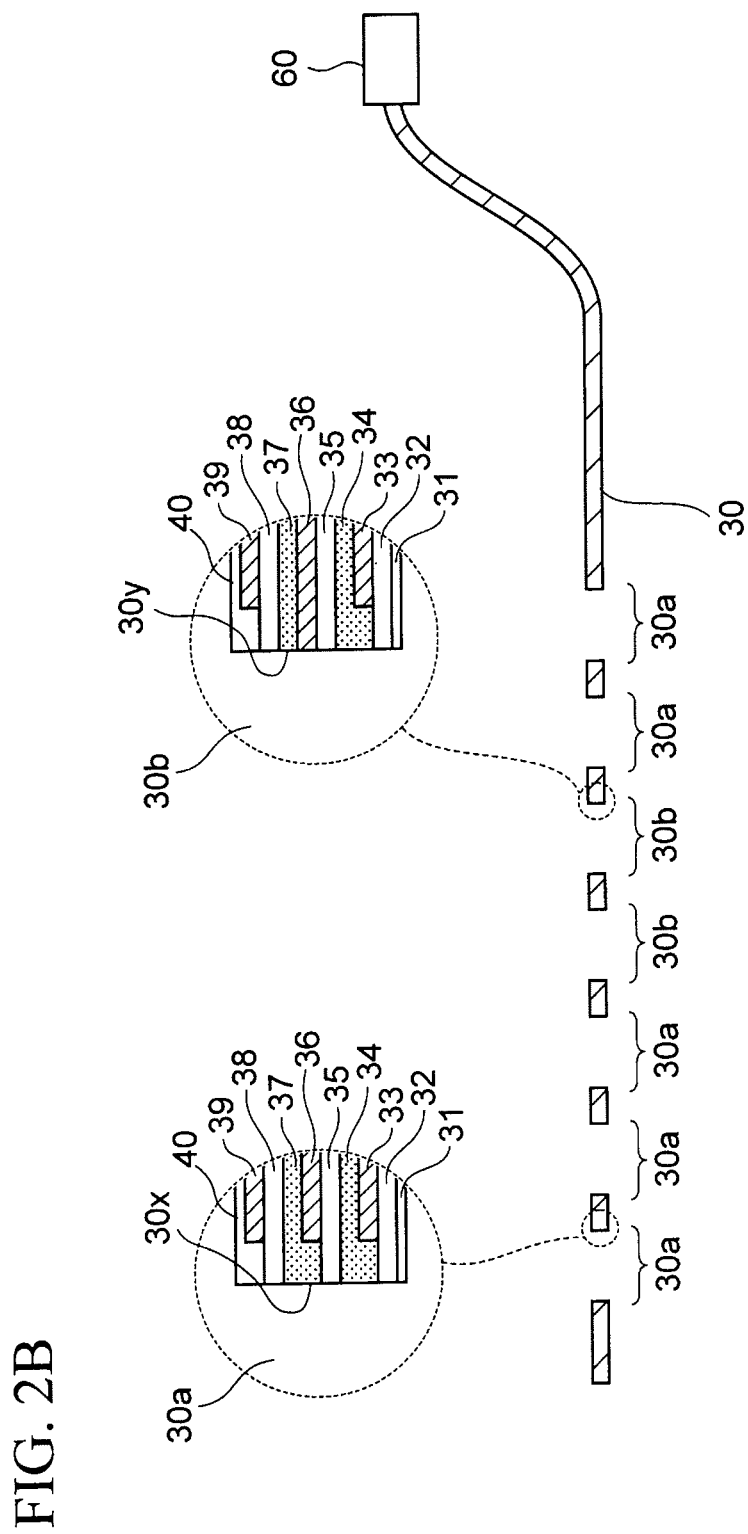

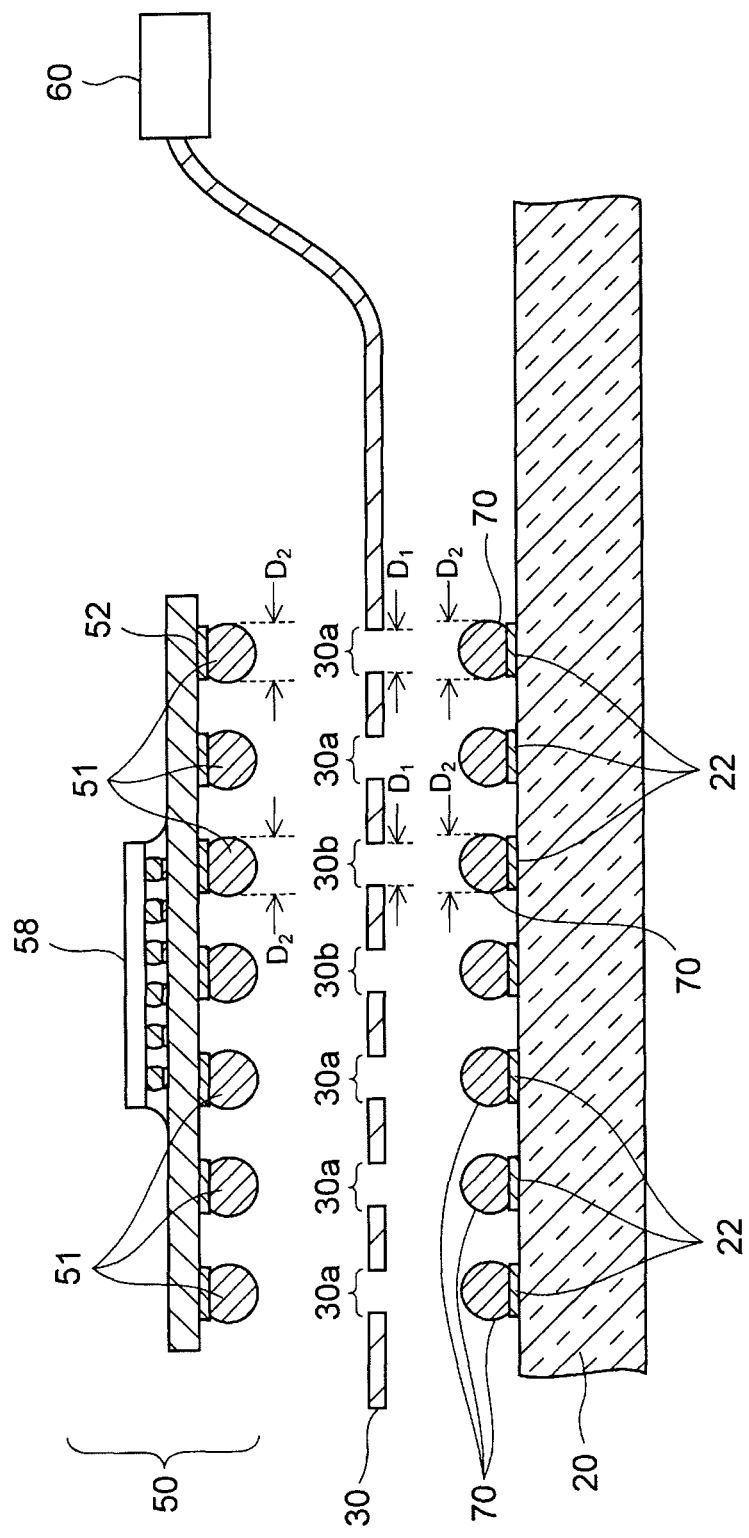

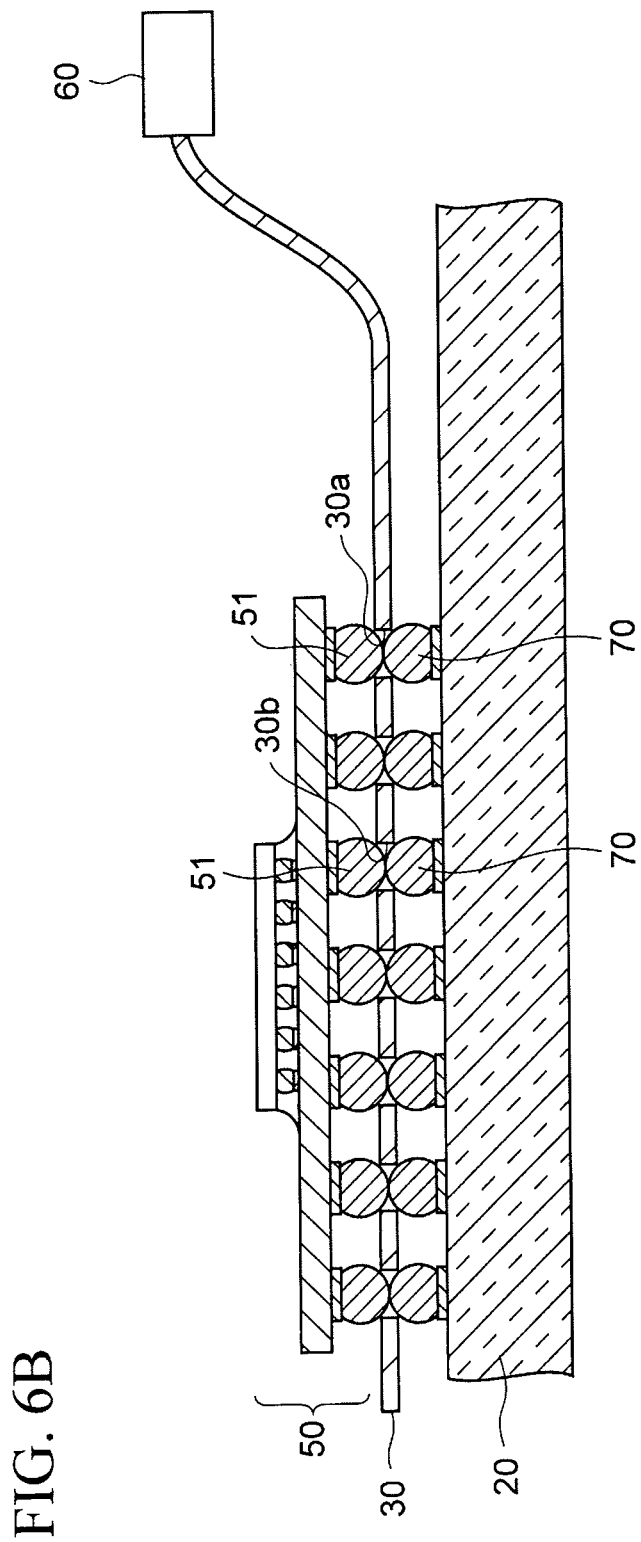

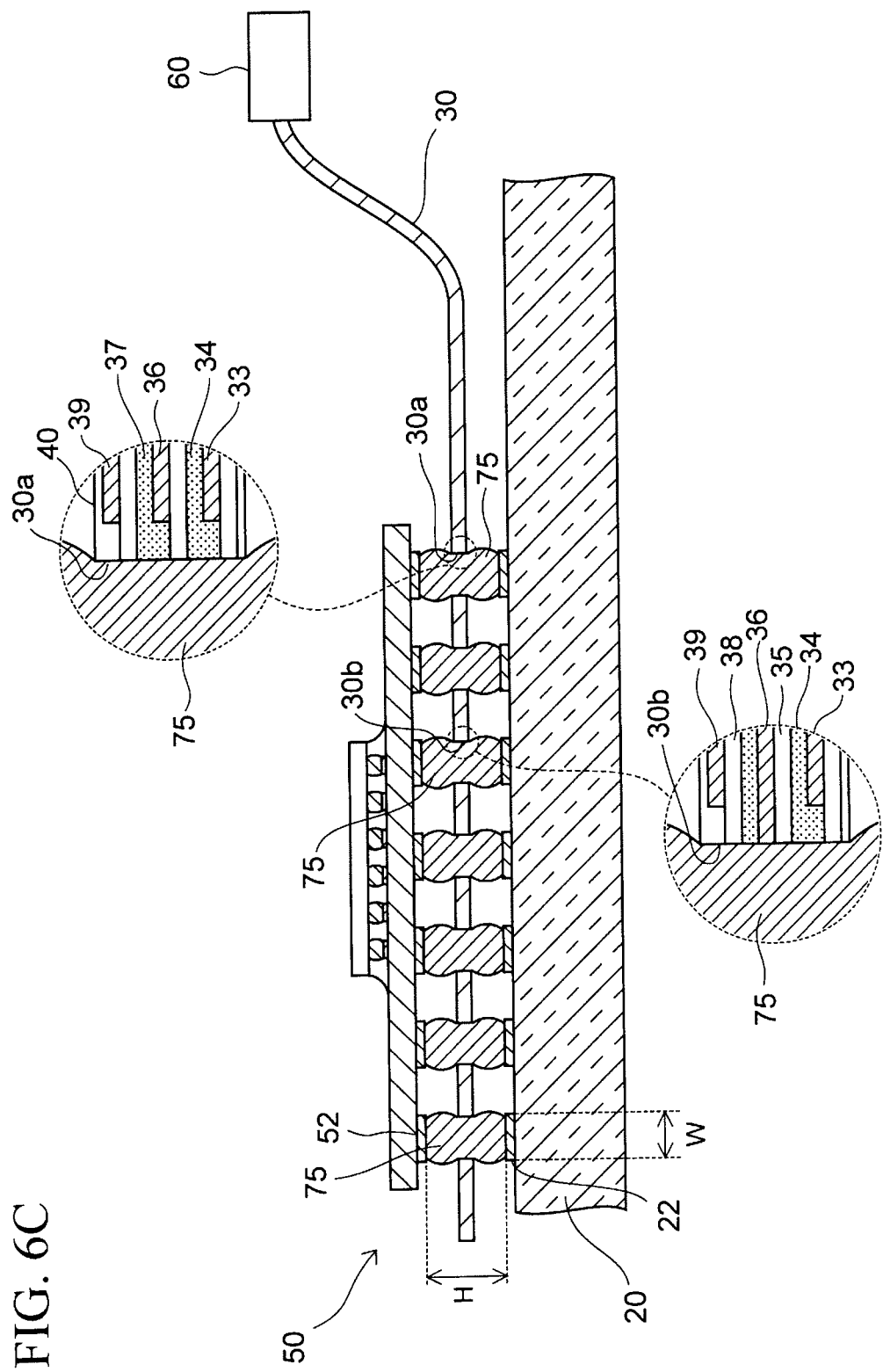

US 9,030,007 B2

SEMICONDUCTOR DEVICE AND MANUFACTURING METHOD THEREOF

CROSS-REFERENCE TO RELATED APPLICATIONS

This application is based upon and claims the benefits of priority of the prior Japanese Patent Application No. 2009-237377, filed on Oct. 14, 2009, and Japanese Patent Application No. 2010-190604, filed on Aug. 27, 2010, the entire contents of which are incorporated herein by reference.

FIELD

It is related to a semiconductor device and a manufacturing method thereof.

BACKGROUND

Along with downsizing of electronic devices in recent years, downsizing of semiconductor components including semiconductor packages and semiconductor elements to be embedded in electronic devices have also been in progress. The semiconductor components are mounted on circuit base members in the electronic devices by use of connection terminals such as solder bumps. Here, it is preferable to increase alignment accuracy between the circuit base members and the semiconductor components in order to improve yields of such electronic devices.

The related arts to this application is disclosed in Japanese Laid-open Patent Publication Nos. 07-183333 and 2007-27305.

SUMMARY

According to one aspect discussed herein, there is provided a semiconductor device including a first circuit base member including a surface on which a plurality of first electrodes are formed, a second circuit base member being provided over the first circuit base member and including a first through hole and a second through hole formed respectively over the plurality of first electrodes, a semiconductor component provided over the second circuit base member and including a surface on which a plurality of second electrodes are formed, and a plurality of first bumps provided in the first through hole and the second through hole and connecting the first electrodes to the second electrodes.

According to another aspect discussed herein, there is provided a method of manufacturing a semiconductor device including disposing a second circuit base member including a first through hole and a second though hole over a first circuit base member including a surface on which a plurality of first electrodes are formed, inserting a plurality of first bumps formed respectively on a plurality of second electrodes on a semiconductor component into the first through hole and the second through hole, thereby bringing the plurality of first bumps into contact with the plurality of first electrodes on the first circuit base member, and heating and fusing the first bumps, thereby bonding the first bumps to the first electrodes.

According to still another aspect discussed herein, there is provided a method of manufacturing a semiconductor device including fitting a plurality of first bumps provided on a first circuit base member respectively into a plurality of through holes in a second circuit base member, fitting a plurality of second bumps provided on a semiconductor component respectively into the plurality of through holes in the second circuit base member, and heating and fusing the first bumps and the second bumps, thereby electrically and mechanically connecting the first circuit base member to the semiconductor component through the first bumps and the second bumps.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIGS. 2A to 2F are cross-sectional views of a semiconductor device according to a first embodiment in the course of manufacturing;

FIGS. 6A to 6C are cross-sectional views of a semiconductor device according to a fourth embodiment in the course of manufacturing;

DESCRIPTION OF THE PREFERRED EMBODIMENTS

To mount a semiconductor component such as a semiconductor package on a circuit base member, an interposer may be provided to connect wirings between the semiconductor component and the circuit base member.

A method of manufacturing a semiconductor device including such an interposer will be described prior to description of the embodiments.

Figure 1A:
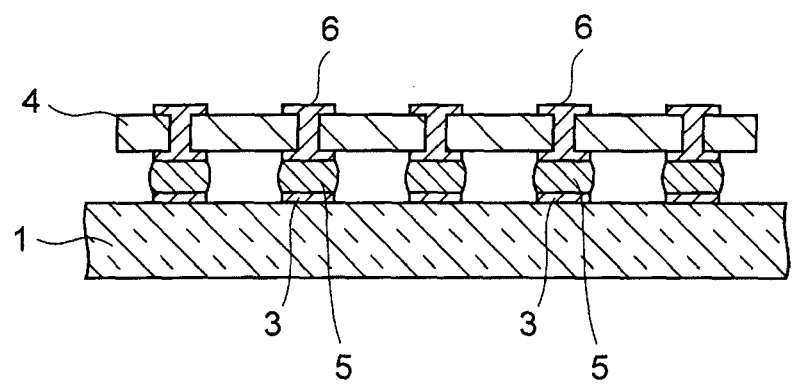
FIGS. 1A and 1B are cross-sectional views of a semiconductor device including an interposer in the course of manufacturing.
Figure 1B:
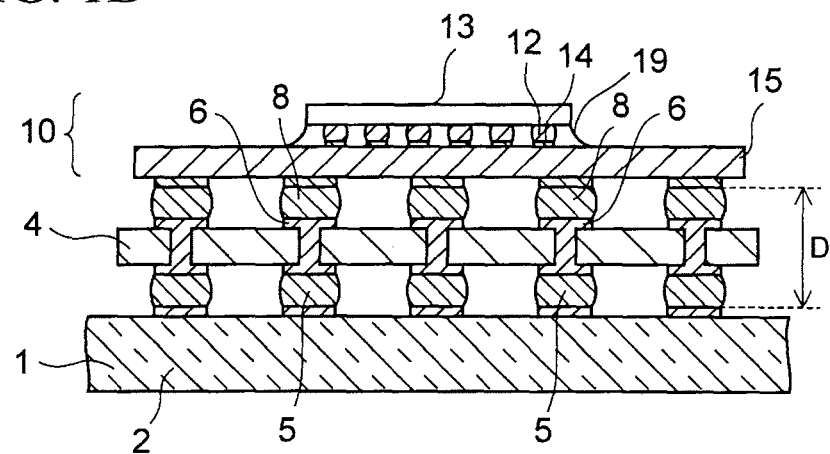

FIGS. 1A and 1B are cross-sectional views of the semiconductor device in the course of manufacturing.

First, as illustrated in FIG. 1A, a circuit base member 1 provided with first electrodes 3 on one of principal surfaces is prepared, and the circuit base member 1 is aligned with an interposer 4.

The interposer 4 is formed by providing second electrodes 6 on a flexible base member such as polyimide. First solder bumps 5 are bonded onto the second electrodes 6.

Then, the circuit base member 1 is connected mechanically and electrically to the interposer 4 by reflowing the first solder bumps 5 being in contact with first electrodes 3.

Next, as illustrated in FIG. 1B, a semiconductor package 10 is placed on the interposer 4.

The semiconductor package 10 includes a package base member 15. Second solder bumps 8 are provided on one of two principal surfaces of the package base member 15 which faces the interposer 4.

Meanwhile, third electrodes 14 are formed on the other principal surface of the package base member 15, and a semiconductor element 13 is connected to the third electrodes 14 via third solder bumps 12.

Here, a gap between the semiconductor element 13 and the package base member 15 is filled with underfill resin 19 for improving connection reliability therebetween.

Then, the second solder bumps 8 are bonded to the second electrodes 6 by reflowing the second solder bumps 8 while the second solder bumps 8 are aligned with the second electrodes 6.

Accordingly, a basic structure of this semiconductor device is completed.

In the method of manufacturing a semiconductor device described above, it is necessary to align the semiconductor package 10 with the interposer 4 at the time of reflow in FIG. 1B so as to bond the second electrodes 6 to the second solder bumps 8 properly.

However, amounts of thermal expansion vary among the circuit base member 1, the interposer 4, and the semiconductor package 10 due to differences in these materials. For this reason, the circuit base member 1, the interposer 4, and the semiconductor package 10 are expanded by different amounts in reflowing the solder bumps 8 in the process of FIG. 1B.

Accordingly, the second electrodes 6 and the second solder bumps 8 cause displacement at the time of reflow, which makes it difficult to achieve highly accurate alignment.

In particular, the interposer 4 is mainly made of polyimide which has a large thermal expansion coefficient and therefore further increases difficulty of alignment.

Moreover, in this structure, the semiconductor package 10 is located away from the circuit base member 1 by an interval D equivalent to a total of heights of the first solder bump 5 and the second solder bump 8 and a thickness of the interposer 4. For this reason, a wiring distance from the semiconductor package 10 to the circuit base member 1 is made so long that RC delay may hinder a high-speed operation of the semiconductor package 10.

As described above, simply providing the interposer 4 between the circuit base member 1 and the semiconductor package 10 causes problems of the difficulty of alignment, reduction in a signal processing speed, and so forth.

In view of these problems, the inventor has accomplished the embodiments described below.

First Embodiment

FIGS. 2A to 2F are cross-sectional views of a semiconductor device according to the present embodiment in the course of manufacturing.

To manufacture the semiconductor device, firstly, a first circuit base member 20 serving as a mount board or the like is prepared as illustrated in FIG. 2A.

The first circuit base member 20 is made of glass epoxy resin or the like and multiple first electrodes 22 are formed on a surface thereof by patterning a copper foil or a copper plated film.

Here, it is also possible to use a multilayer circuit board formed by laminating multiple wirings and insulating layers as the first circuit base member 20. In addition, rigidity of the first circuit base member 20 is not particularly limited, and both of a flexible circuit base member and a rigid circuit base member may be used as the first circuit base member 20.

As illustrated in FIG. 2B, in addition to the above-described first circuit base member 20, a second circuit base member 30 provided with multiple first through holes 30a and second through holes 30b is prepared. Here, a connector 60 for extracting signals may also be provided at an end of this second circuit base member 30.

As illustrated in dotted circles, the second circuit base member 30 has a laminated structure formed by laminating layers 31 to 41. From bottom to top, the lamination structure includes a first coverlay 31, a first insulating layer 32, a first ground wiring 33, a first adhesive layer 34, a second insulating layer 35, a signal wiring 36, a second adhesive layer 37, a third insulating layer 38, a second ground wiring 39, and a second coverlay 40.

Among them, the first to third insulating layers 32, 35, and 38 are formed of flexible resin films made only of resin. In this embodiment, each of the layers 32, 35, and 38 is formed of Upilex made by Ube Industries, Ltd. which is a polyimide film. Moreover, thicknesses of these insulating layers 32, 35, and 38 are not particularly limited. In this embodiment, each of the insulating layers 32, 35, and 38 is formed to have a thickness of about 15 μm.

By using the insulating layers 32, 35, and 38 having flexibility in this manner, the second circuit base member 30 itself becomes also flexible.

Meanwhile, the first and second adhesive layers 34 and 37 are composed of TFA-860FB made by Kyocera Chemical Corporation having an insulating property and a thickness of about 15 μm.

Further, the first and second ground wirings 33 and 39 as well as the signal wiring 36 are formed of electrolytic copper plated films having a thickness of about 9 μm. The signal wiring 36 is formed on an upper surface of the second insulating layer 35, and the third insulating layer 38 is formed so as to cover the signal wiring 36 and the second insulating layer 35.

In this embodiment, the second circuit base member 30 is produced by forming a laminated body having a thickness of about 0.1 mm by bonding these layers 31 to 40 together and then forming the first through holes 30a and the second through holes 30b each having a diameter of about 0.7 mm in the laminated body by drilling.

Of the through holes 30a and 30b thus formed, the signal wiring 36 is exposed in an inner surface 30y of the second through holes 30b.

On the other hand, in each first through hole 30a, the signal wiring 36 is isolated from an inner surface 30x of the through hole 30a by the insulating second adhesive layer 37.

Figure 3:
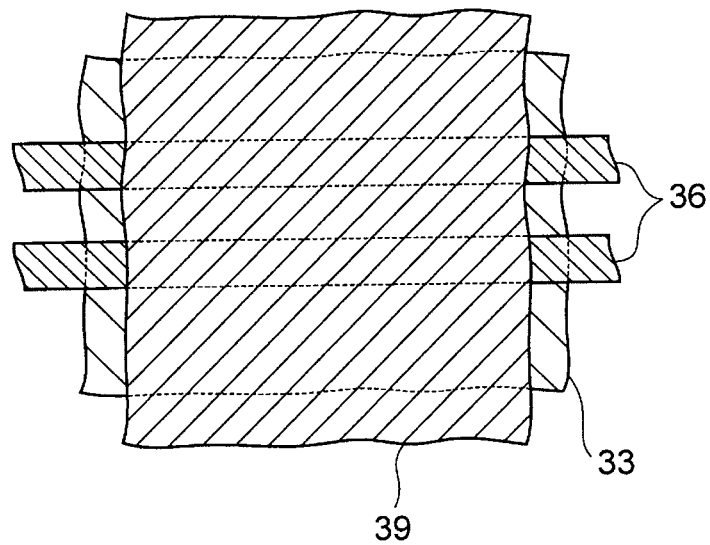
FIG. 3 is an enlarged plan view of a second circuit base member used in the first embodiment.

FIG. 3 is an enlarged plan view of this second circuit base member 30.

As illustrated in FIG. 3, the first ground wiring 33 and the second ground wiring 39 are formed on the entire surface of the second circuit base member 30 except the through holes 30a and 30b.

Meanwhile, the planer shape of the signal wiring 36 is a line shape, and two lines of the signal wiring 36 function as a differential wiring in pair. In the differential wiring, signals having opposite phases are supplied to two lines of the signal wiring 36. This structure is advantageous for improving noise resistance and speeding up the device.

Moreover, these ground wirings 33 and 39 and the signal wiring 36 has a strip line structure which is suitable for transmission of high-frequency signals.

Figure 2C:
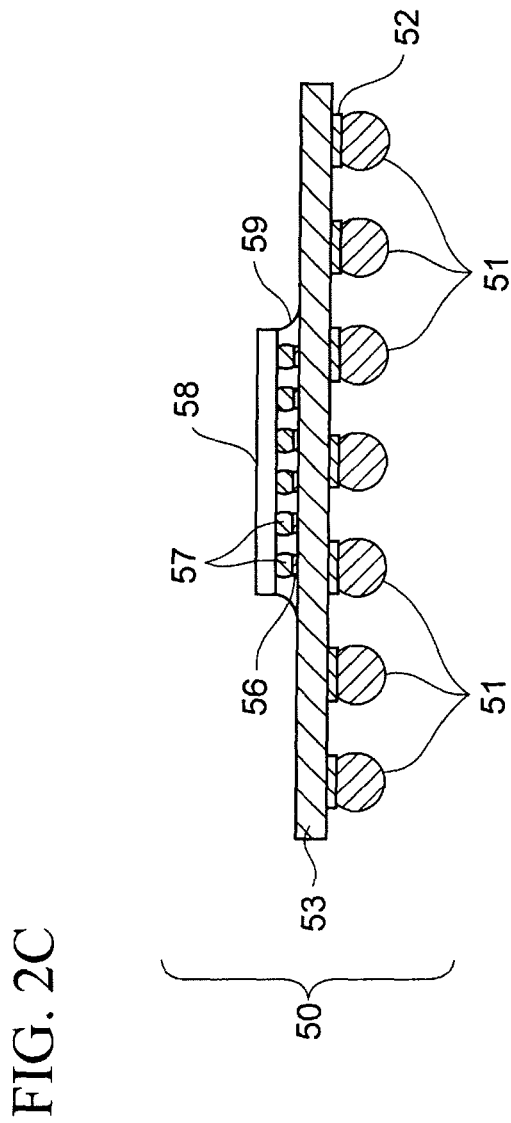

Meanwhile, a semiconductor package 50 as illustrated in FIG. 2C is prepared in addition to the above-described second circuit base member 30.

The semiconductor package 50 is the package of so-called a BGA (ball grid array) type, which includes a package base member 53 and a semiconductor element 58.

Of two principal surfaces of the package base member 53, the principal surface, on which the semiconductor element 58 is not mounted, is provided with multiple second electrodes 52 arranged in a grid fashion.

The second electrodes 52 are formed by patterning a copper plated film or the like, and first solder bumps 51 are bonded to surfaces thereof.

Meanwhile, third electrodes 56 is formed by patterning a copper plated film on the principal surface of the package base member 53 on which the semiconductor element 58 is mounted, and protruding electrodes 57 are bonded to the third electrodes 56.

The protruding electrodes 57 are solder bumps, for example, which are also bonded to unillustrated electrodes of the semiconductor element 58.

Then, a gap between the package base member 53 and the semiconductor element 58 is filled with underfill resin 59 for improving connection reliability therebetween.

Figure 2D:
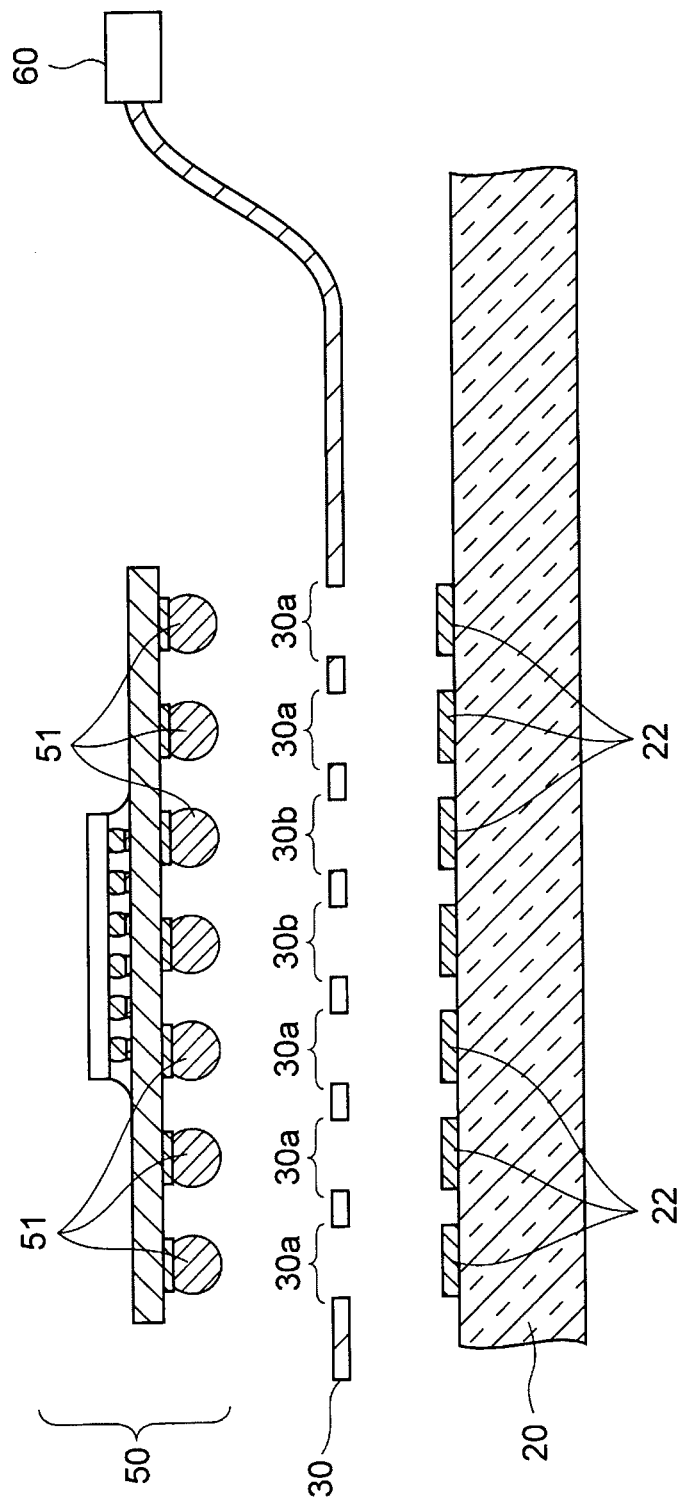

Subsequently, as illustrated in FIG. 2D, the first circuit base member 20, the second circuit base member 30, and the semiconductor package 50 are arranged in this order from bottom to top. Then, the first circuit base member 20 is aligned with the second circuit base member 30 so as to locate the through holes 30a and 30b over first electrode pads 22.

Similarly, the second circuit base member 30 is aligned with the semiconductor package 50 so as to locate the first solder bumps 51 over the through holes 30a and 30b.

Figure 2E:
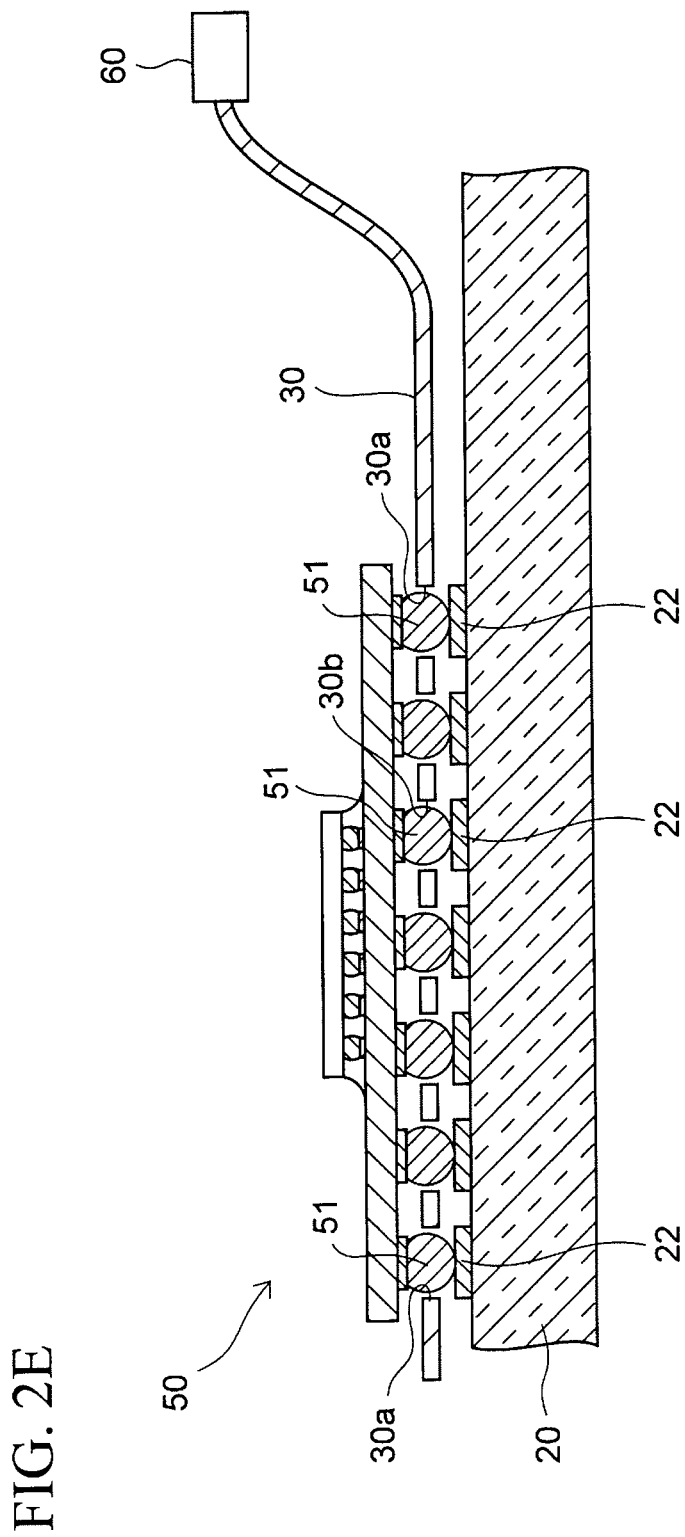

Subsequently, as illustrated in FIG. 2E, the multiple first solder bumps 51 provided on the semiconductor package 50 are inserted into the first through holes 30a and the second through holes 30b so as to bring the solder bumps 51 into contact with the multiple first electrodes 22 which are formed on the surface of the first circuit base member 20.

At this time, intervals between the adjacent first solder bumps 51 and diameters of the solder bumps 51 may vary. Therefore, it is preferable to form diameters of the respective through holes 30a and 30b to be larger than the diameters of the first solder bumps 51 in order to tolerate such variations.

For example, when the diameter of the first solder bumps 51 is about 0.6 μm, it is preferable to form the through holes 30a and 30b to have a larger diameter such as 0.7 μm.

Figure 2F:
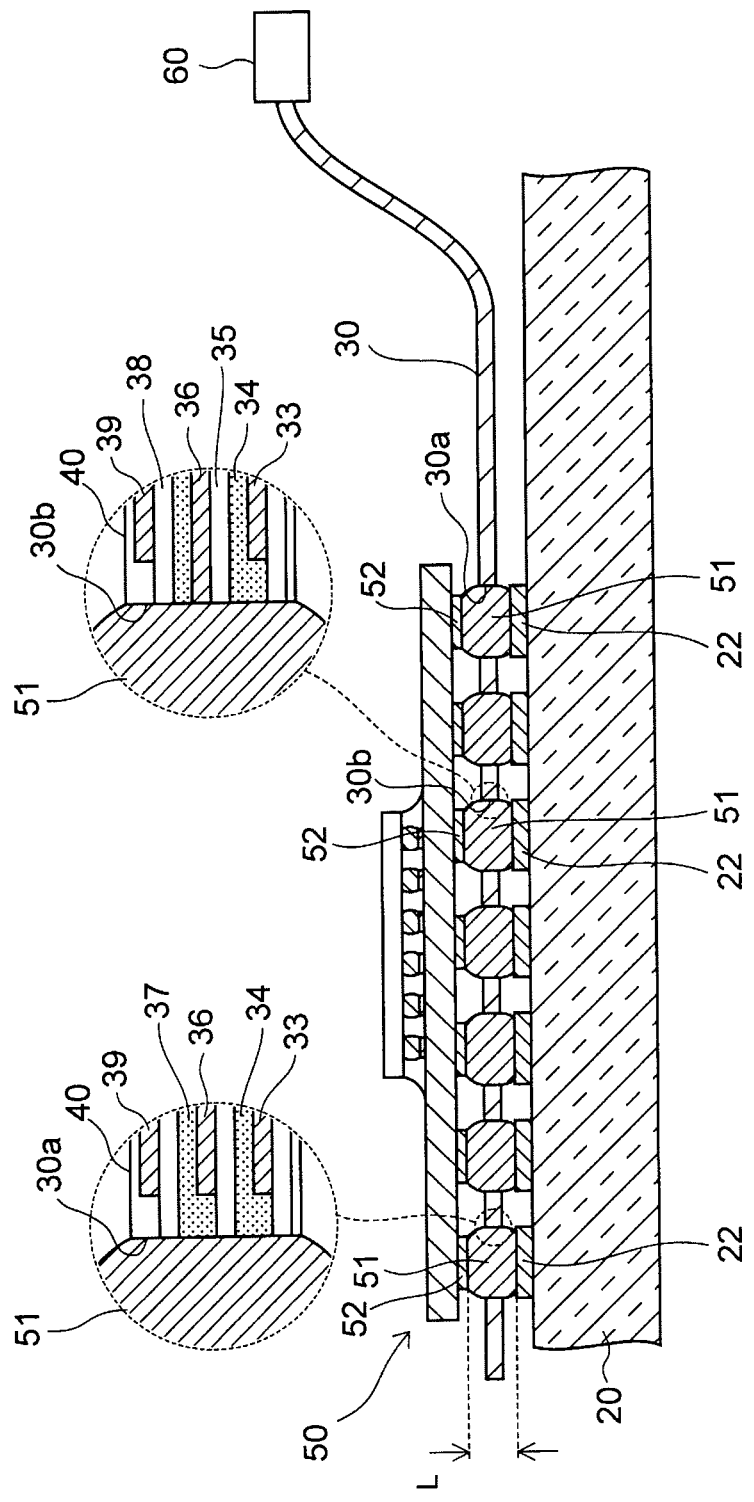

Next, as illustrated in FIG. 2F, by reflowing and heating the first solder bumps 51 to a temperature higher than the melting point of the solder bumps 51, the solder bumps 51 are fused and bonded to the first electrodes 22.

At this time, the circuit base members 20 and 30 and the semiconductor package 50 are thermally expanded by different amounts due to a difference in the materials.

However, in this embodiment, the through holes 30a and 30b of the second circuit base member 30 function so as to hold the first solder bumps 51. Accordingly, it is possible to suppress displacement among the circuit base members 20 and 30 and the semiconductor package 50 due to the difference in the amounts of thermal expansion.

Thereafter, by cooling down and solidifying the first solder bumps 51, the first circuit base member 20, the second circuit base member 30, and the semiconductor package 50 are connected mechanically and electrically to one another by the first solder bumps 51.

As described previously, wirings 33, 36, and 39 is not exposed on the inner surface of the first through holes 30a. Accordingly, the first solder bumps 51 in the first through holes 30a are not connected to the wirings 33, 36, and 39 in the second circuit base member 30.

On the other hand, in the second through holes 30b, the signal wiring 36 is exposed on the inner surfaces thereof. Therefore, the first bumps 51 in the second holes 30b are electrically connected to the signal wiring 36, whereby a predetermined signal is supplied from the semiconductor package 50 to the second circuit base member 30.

Then, the signal is inputted to and outputted from other electronic components and the like through the connector 60 which is connected to the second circuit base member 30. In this manner, in this semiconductor device, it is possible to separate the predetermined signal from other signal of the semiconductor package 50, and to supply these signals to the first circuit base member 20 and the second circuit material 30 separately.

In this way, a basic structure of the semiconductor device of this embodiment is completed.

According to the above-described embodiment, as illustrated in FIG. 2F, the second circuit base member 30 is provided with the through holes 30a and 30b, and the first solder bumps 51 are inserted to these through holes 30a and 30b.

According to this, the through holes 30a and 30b of the second circuit base member 30 function to hold the fused first solder bumps 51 when reflowing the first solder bumps 51, and to regulate movement of the first solder bumps 51. Accordingly, even when the circuit base members 20 and 30 and the semiconductor package 50 have different amounts of thermal expansion due to the difference in the materials, it is possible to prevent occurrence of displacement among the first solder bumps 51 and the electrodes 22 and 52.

Moreover, in this embodiment, the semiconductor package 50 is mounted on the first circuit base member 20 by utilizing only one layer of the first solder bumps 51 instead of providing two layers of solder bumps 5 and 6 as illustrated in FIG. 1B.

For this reason, reflowing of the solder bumps 51 is required to be performed just once in the mounting process. Accordingly, it is possible to further reduce the risk of causing the displacement among the first bumps 51 and the respective electrodes 22 and 52 as compared to the case of reflowing twice as illustrated in FIGS. 1A and 1B.

In addition, by providing only one layer of the first solder bumps 51 as described above, it is possible to narrow an interval L between the first circuit base member 20 and the semiconductor package 50 as compared to the example in FIG. 1B. In this way, it is possible to reduce a distance of drawing the wiring from the semiconductor package 50 to the first circuit base member 20, and to provide the semiconductor device capable of suppressing RC delay and performing high-speed operation.

Meanwhile, the predetermined signal of the semiconductor package 50 is arranged to flow from the second through holes 30b to the signal wiring 36 in the second circuit base member 30. As described previously, two lines of the signal wiring 36 function as the differential wiring in pair. Therefore, it is possible to speed up the device while maintaining a low noise level of the signal.

Particularly, since the signal wiring 36 is sandwiched between the second insulating layer 35 and the third insulating layer 39 which are made of resin such as polyimide having a uniform dielectric constant. Therefore, fluctuation in the dielectric constant is suppressed in the region along a signal path.

In contrast, in the case of a circuit base member having a composite material prepared by impregnating a glass cloth with thermosetting resin, the dielectric constant of the glass cloth is higher than that of the thermosetting resin. Therefore, the dielectric constant in the vicinity of the signal wiring varies at the weave pattern of the glass cloth. Accordingly, a delay in propagation time occurs between two lines of the signal wiring constituting a differential wiring, and when the delay exceeds the acceptable value, the semiconductor package 50 cannot process the signal any longer.

In this embodiment, the insulating layers 35 and 38 and the adhesive layers 34 and 37 are made only of resin without using any glass cloth. Therefore, there is no risk of causing a delay in the propagation time of the signal due to a weave pattern of such a glass cloth. Hence the semiconductor package 50 can process signals at a high speed.

Second Embodiment

Next, a second embodiment will be described.

In this embodiment, a technique advantageous for scaling down semiconductor devices than in the first embodiment is described.

FIGS. 4A to 4D are cross-sectional views of a semiconductor device according to the present embodiment in the course of manufacturing. In these drawings, the same constituents as those explained in conjunction with the first embodiment will be designated by the same reference numerals as in the first embodiment and explanation thereof will be omitted below.

Figure 4A:
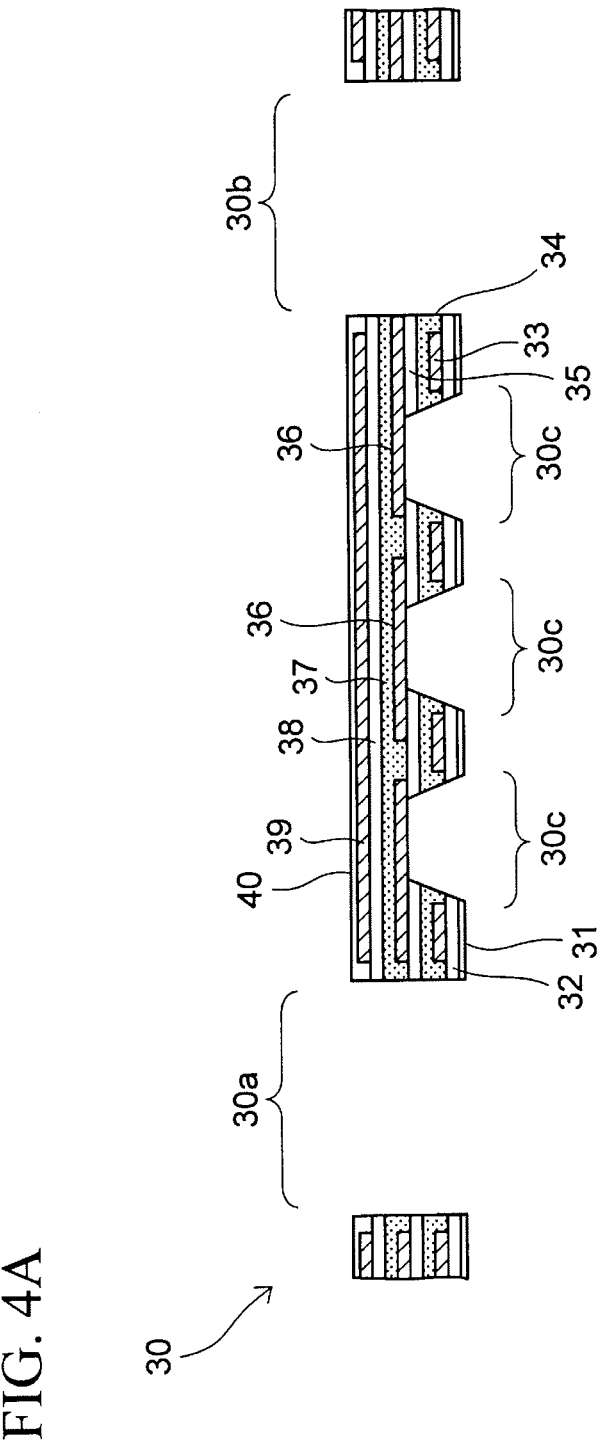
FIGS. 4A to 4D are cross-sectional views of a semiconductor device according to a second embodiment in the course of manufacturing.

To manufacture the semiconductor device, firstly, the second circuit base member 30 described in the first embodiment is prepared as illustrated in FIG. 4A.

However, in the present embodiment, multiple recessed portions 30c are formed in advance in one of two principal surfaces of the second circuit base member 30, which faces the first circuit base member described later.

The method of forming the recessed portions 30c is not particularly limited. For example, the recessed portions 30c may be formed by radiating carbon dioxide laser so as to cause evaporation of predetermined portions in the second circuit base member 30. Alternatively, the recessed portions 30c may be formed by removing predetermined portions in the second circuit base member 30 by means of wet etching using an unillustrated resist pattern as a mask. In any case, the signal wiring 36 functions as a stopper against the laser or wet etching, and the recessed portions 30c will never be formed deeper than the signal wiring 36.

Figure 4B:
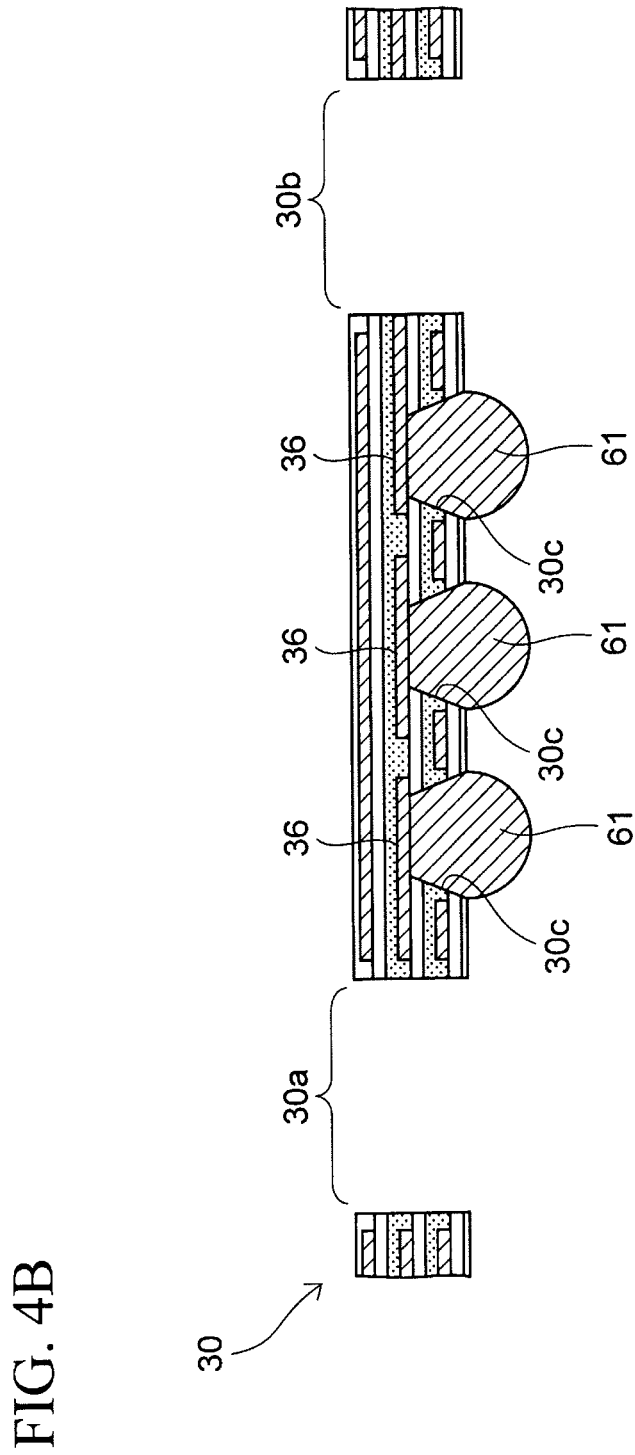

Subsequently, as illustrated in FIG. 4B, second solder bumps 61 are provided in the recessed portions 30c, and the second solder bumps 61 are bonded onto the signal wiring 36 exposed on bottom surfaces of the recessed portions 30c.

Although a diameter of the second solder bumps 61 is not particularly limited, it is preferable to form the second solder bumps 61 in a diameter smaller than that of the first solder bumps 51 (see FIG. 2C) described in the first embodiment. For example, the diameter of the second solder bumps 61 is set preferably in a range from 0.2 mm to 0.4 mm.

Moreover, the material of the second solder bumps 61 is not particularly limited. The second solder bumps 61 may be made of the same material as the first solder bumps 51.

Figure 4C:
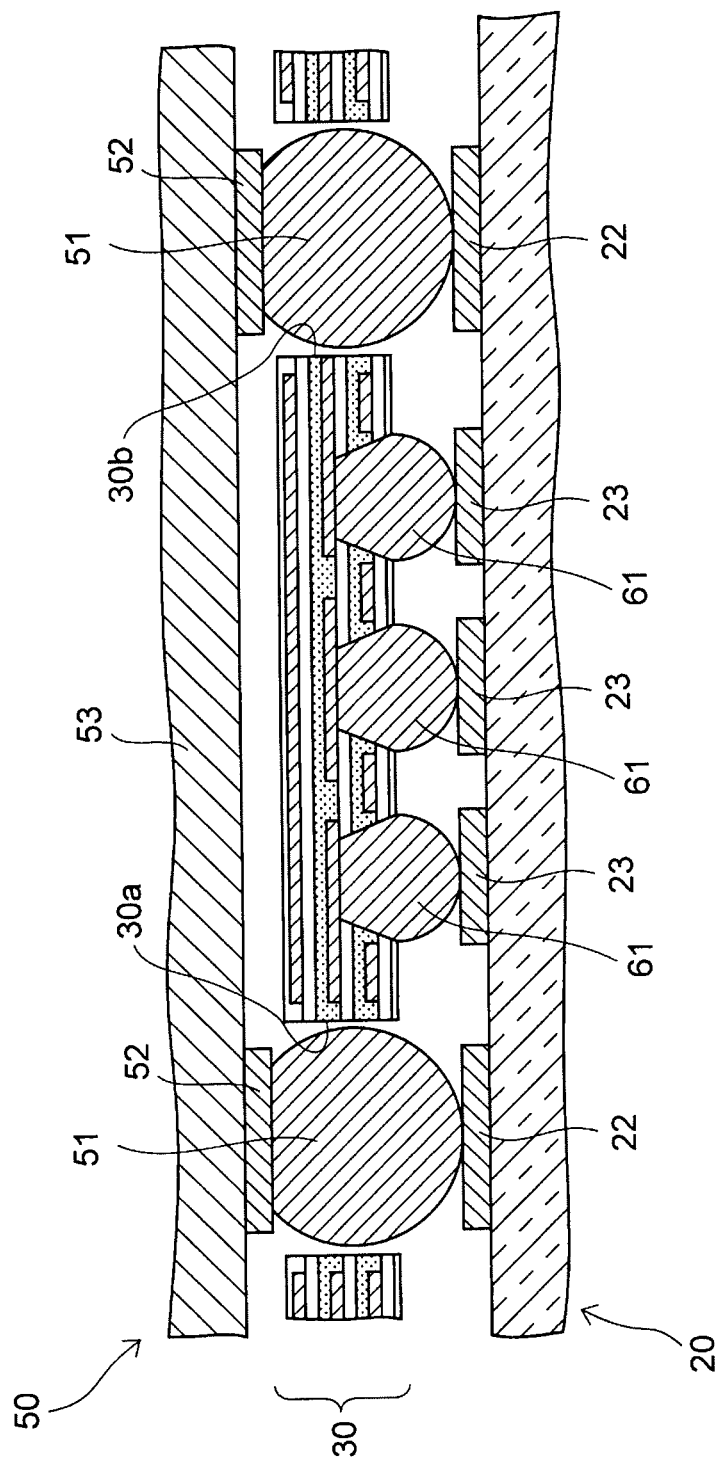

Next, as illustrated in FIG. 4C, the multiple first solder bumps 51 provided on the semiconductor package 50 are inserted into the first through holes 30a and the second through holes 30b so as to bring the first solder bumps 51 into contact with the first electrodes 22.

In this embodiment, multiple third electrodes 23 are formed on the surface of the first circuit base member 20, and the second solder bumps 61 are brought into contact with those third electrodes 23 in this step.

Figure 4D:
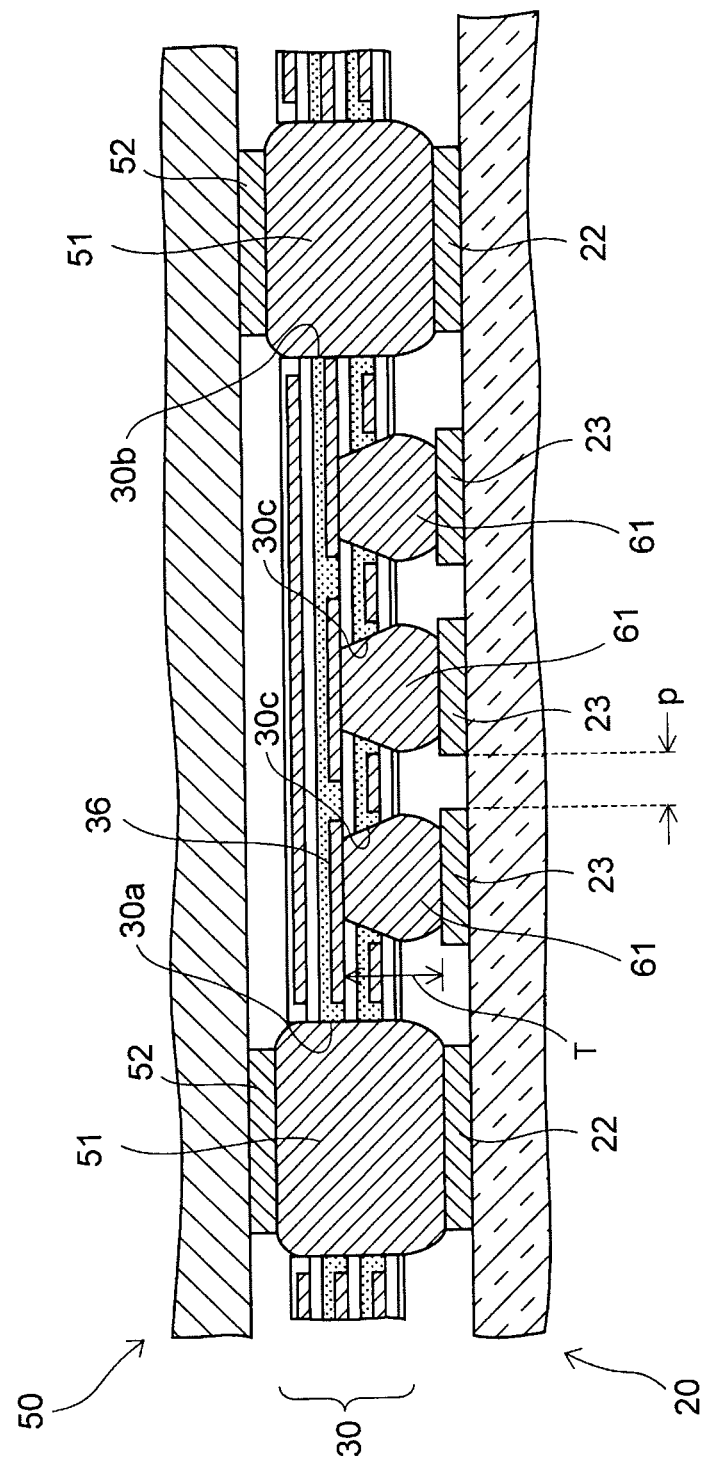

Thereafter, as illustrated in FIG. 4D, the solder bumps 51 and 61 are fused and bonded to the respective electrodes 22 and 23 by reflowing and heating the respective solder bumps 51 and 61 to a temperature higher than the melting points of the solder bumps 51 and 61.

In this way, a basic structure of the semiconductor device of this embodiment is completed.

According to the present embodiment, the second solder bumps 61 are provided in the recessed portions 30c in the second circuit base member 30 in addition to the first solder bumps 51. Therefore, the solder bumps 51 and 61 are arranged more densely as compared to the first embodiment.

For this reason, it is possible to reduce an interval P between two adjacent third electrodes 23 on the first circuit base member 20, and thereby to contribute to downsizing of the semiconductor device.

Further, by making the diameter of the second solder bumps 61 smaller than the diameter of the first solder bumps 51, it is possible to further reduce the interval P between the third electrodes 23 and to achieve further downsizing of the semiconductor device.

In addition, an interval T between the signal wiring 36 and the third electrodes 23 is narrowed by providing the second solder bumps 61. Accordingly, it is possible to effectively reduce the RC delay than in the first embodiment, and further speed up the semiconductor device.

Third Embodiment

In the above-described second embodiment, as illustrated in FIG. 4D, the interval P between the adjacent third electrodes 23 on the first circuit base member 20 is reduced by providing the second solder bumps 61 on one of the two principal surfaces of the second circuit base member 30 facing the first circuit base member 20.

On the other hand, in the present embodiment, an interval between the electrodes of the semiconductor package 50 is reduced by turning the second circuit base member 30 upside down than in the second embodiment.

Figure 5A:
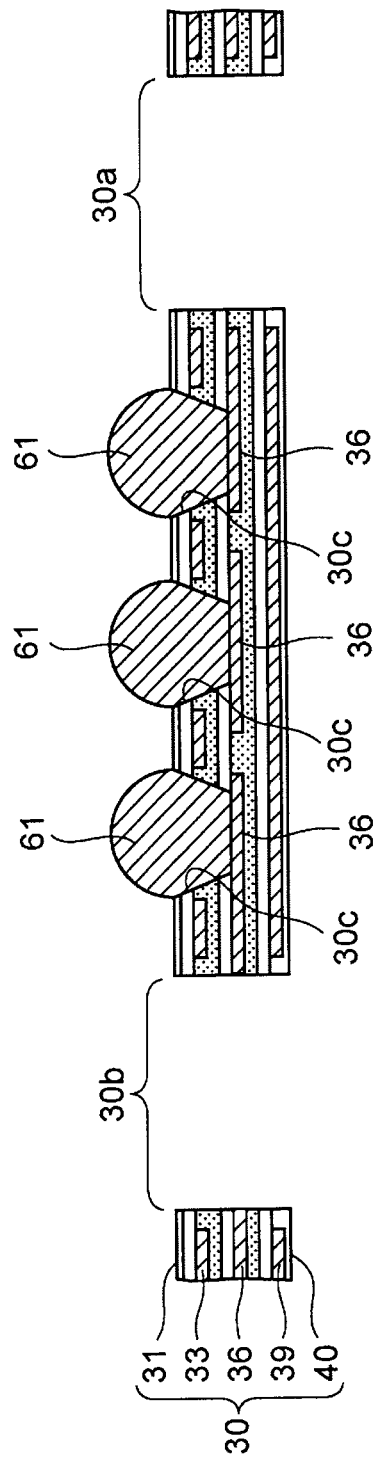
FIGS. 5A to 5C are cross-sectional views of a semiconductor device according to a third embodiment in the course of manufacturing.
Figure 5B:
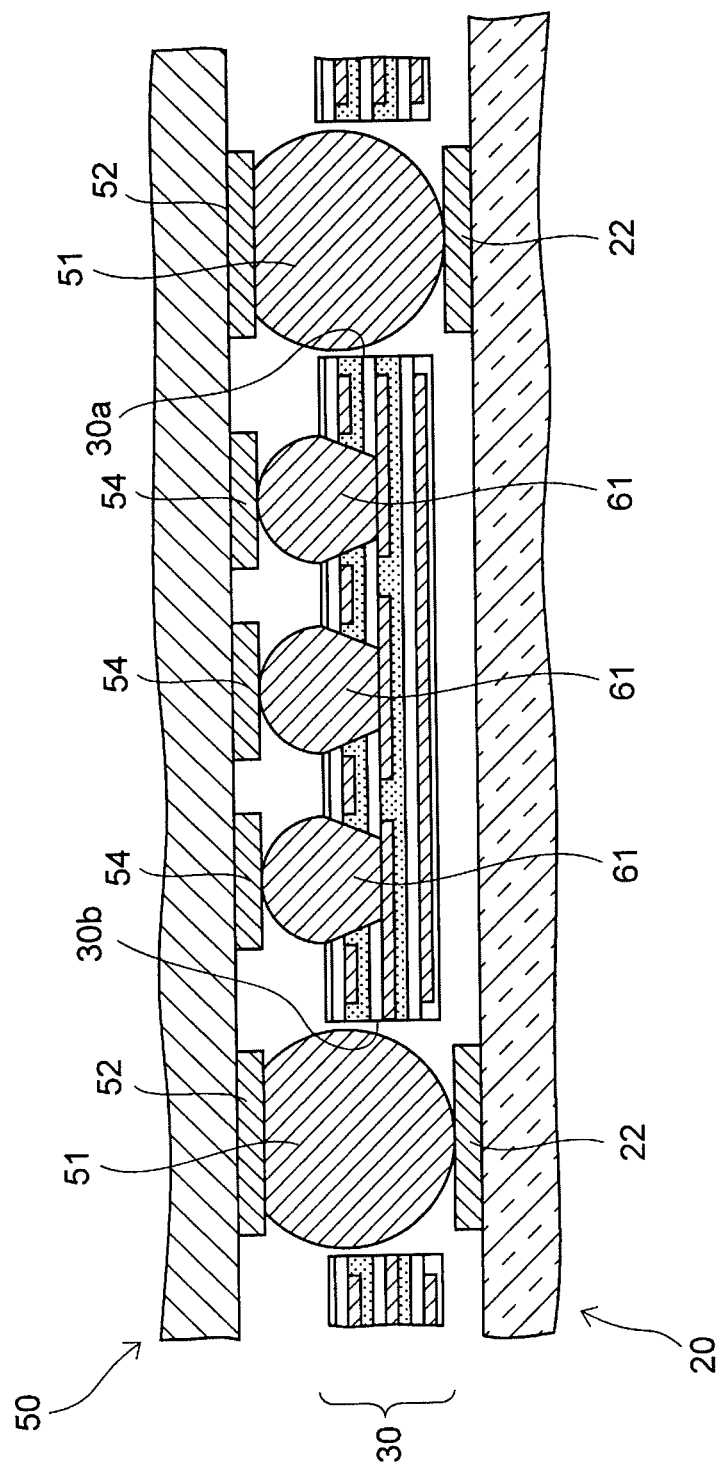
Figure 5C:
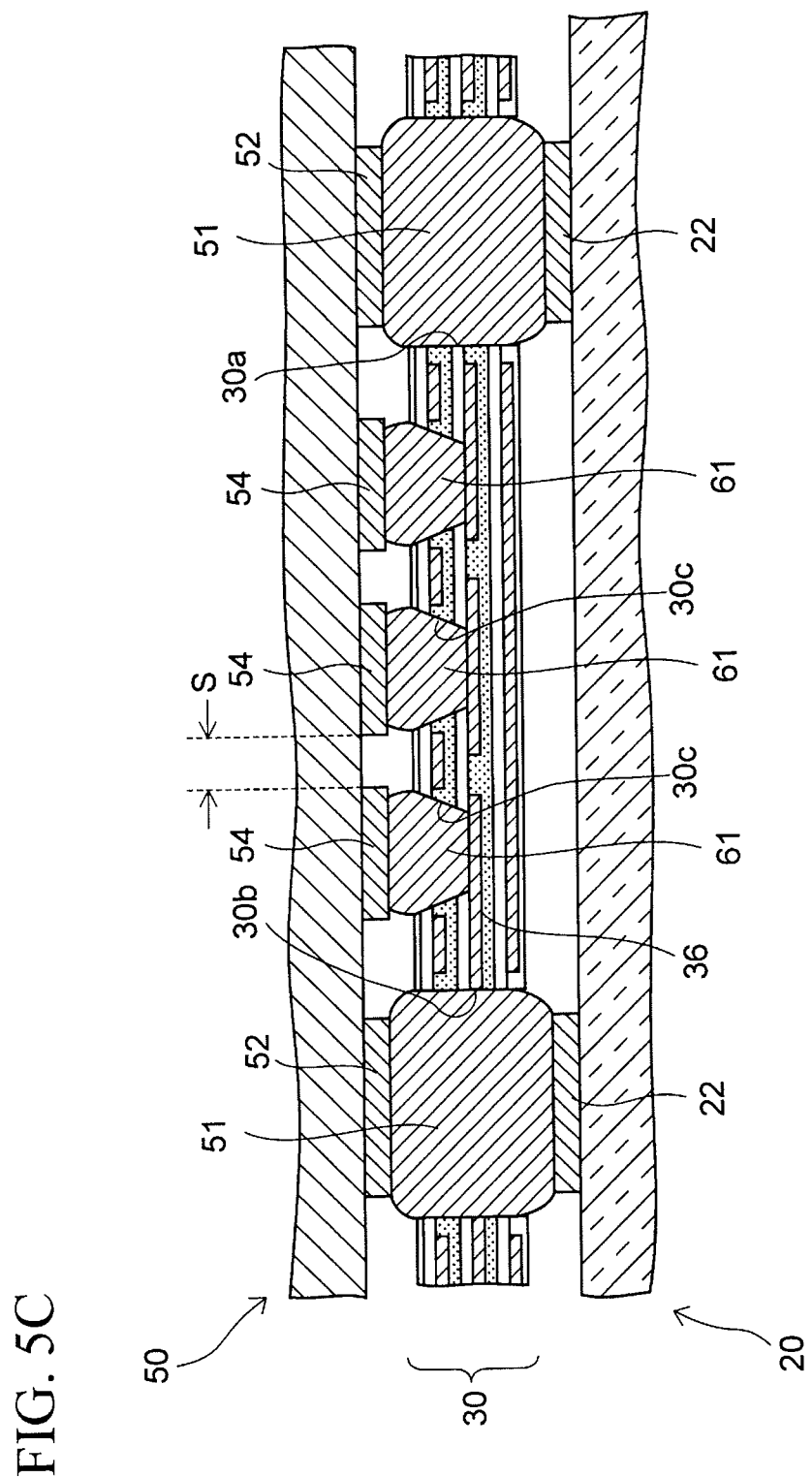

FIGS. 5A to 5C are cross-sectional views of a semiconductor device according to the present embodiment in the course of manufacturing. In these drawings, the same constituents as those explained in conjunction with the second embodiment will be designated by the same reference numerals as in the second embodiment and explanation thereof will be omitted below.

First, as illustrated in FIG. 5A, the second circuit base member 30 is prepared by locating the second solder bumps 61 upward.

As described in the second embodiment, the respective second solder bumps 61 are bonded onto the signal wiring 36 exposed on the bottom surfaces of the recessed portions 30c. The diameter of the second solder bumps 61 is in the range from about 0.2 mm to 0.4 mm, which is smaller than the diameter of the first solder bumps 51 (see FIG. 2C) explained in the first embodiment.

Next, as illustrated in FIG. 5B, the multiple first solder bumps 51 provided on the semiconductor package 50 are inserted into the first through holes 30a and the second through holes 30b so as to bring the solder bumps 51 into contact with the first electrodes 22 of the first circuit base member 20.

Here, multiple fourth electrodes 54 are provided on the surface of the semiconductor package 50 of the present embodiment in addition to the second electrodes 52.

In this step, the second solder bumps 61 are brought into contact with those fourth electrodes 54.

Subsequently, as illustrated in FIG. 5C, the solder bumps 51 and 61 are fused and bonded to the first electrodes 22 and the fourth electrodes 54, respectively, by reflowing and heating the solder bumps 51 and 61 to the temperature higher than the melting points of the solder bumps 51 and 61.

In this way, a basic structure of the semiconductor device of to this embodiment is completed.

According to the present embodiment, the second solder bumps 61 are provided in addition to the first solder bumps 51 as similar to the second embodiment. Therefore, the solder bumps 51 and 61 are arranged more densely as compared to the first embodiment.

Moreover, the semiconductor package 50 is connected to the second circuit base member 30 by way of the densely arranged second solder bumps 61. Hence, it is possible to arrange the fourth electrodes 54 of the second semiconductor package 50 more densely in line with the arrangement of the second solder bumps 61.

In this way, it is possible to reduce an interval S between the two adjacent fourth electrodes 54 of the semiconductor package 50, and thereby to contribute to downsizing of the semiconductor device.

Fourth Embodiment

In the first embodiment, as illustrated in FIG. 2D, the first solder bumps 51 are provided only on the semiconductor package 50 when mounting the semiconductor package 50 on the first circuit base member 20 without providing any solder bumps on the first circuit bases material 20.

On the other hand, in this embodiment, the solder bumps are provided on both the first circuit base member 20 and the semiconductor package 50 as described below.

FIGS. 6A to 6C are cross-sectional views of a semiconductor device according to this embodiment in the course of manufacturing. In these drawings, the same constituents as those explained in conjunction with the first embodiment will be designated by the same reference numerals as in the first embodiment and explanation thereof will be omitted below.

To manufacture this semiconductor device, firstly, the first circuit base member 20, the second circuit base member 30, and the semiconductor package 50 are prepared as illustrated in FIG. 6A.

As similar to the first embodiment, the multiple first solder bumps 51 are bonded to the second electrodes 52 of the semiconductor package 50.

On the other hand, multiple second solder bumps 70 are bonded to the second electrodes 22 of the first circuit base member 20.

Moreover, the first through holes 30a and the second through holes 30b are formed in the second circuit base member 30 as similar to the first embodiment. Although a diameter $D_1$ of the through holes 30a and 30b is not particularly limited, it is referable to set the diameter $D_1$ smaller than a diameter $D_2$ of the bumps 51 and 70.

In the present embodiment, the diameter $D_1$ of the through holes 30a and 30b is set to about 0.4 mm, while the diameter $D_2$ of the bumps 51 and 70 is set to about 0.6 mm.

Note that it is not necessary to set the diameter of the first solder bumps 51 equal to the diameter of the second solder bumps 70, and the diameters of the bumps 51 and 70 may be different.

Next, as illustrated in FIG. 6B, the second circuit base member 30 is moved down toward the first circuit base member 20, so as to fit the second solder bumps 70 into the through holes 30a and 30b.

Here, since the diameter $D_1$ of the through holes 30a and 30b is formed smaller than the diameter $D_2$ of the second bumps 70 as described above, the second solder bumps 70 do not path through the through holes 30a and 30b in this step, and the second circuit base member 30 is locked by the solder bumps 70.

Thereafter, the semiconductor package 50 is moved down toward the second circuit base member 30, and the first solder bumps 51 are fitted into the through holes 30a and 30b.

In this embodiment, by fitting the bumps 51 and 70 into the through holes 30a and 30b in this manner, relative positions of the circuit base members 20 and 30 and the semiconductor package 50 are determined in a self-aligned manner, thereby facilitating the alignment of these constituents.

Subsequently, as illustrated in FIG. 6C, columnar connecting media 75 are formed by heating and fusing the solder bumps 51 and 70. Then, as the connection media 75 are cooled down and solidified, the first electrodes 22 of the first circuit base member 20 are connected electrically and mechanically to the second electrodes 52 of the semiconductor package 50.

Moreover, the signal wiring 36 exposed on the inner surfaces of the second through holes 30b is connected to the connection media 75, whereby the predetermined signal is supplied from the semiconductor package 50 to the second circuit base member 30.

Since the signal wiring 36 is not exposed on the inner surfaces of the first through holes 30a as explained in the first embodiment, the signal wiring 36 is not connected to the connection media 75 in the first through holes 30a.

Here, in order to completely fill the through holes 30a and 30b with the connection media 75 without generating any voids, it is preferable that each tops of the solder bumps 51 and 70 before fusion contact one another without separation as illustrated in FIG. 6B.

In this way, a basic structure of the semiconductor device of this embodiment is completed.

According to this embodiment, as described with reference to FIG. 6B, the solder bumps 51 and 70 are fitted into the through holes 30a and 30b in the second circuit base member 30. In this way, it is possible to determine the relative positions among the circuit base members 20 and 30 and the semiconductor package 50 automatically and to align these constituents easily.

Moreover, as illustrated in FIG. 6C, the connection media 75 formed by fusing the solder bumps 51 and 70 have the shape obtained by joining the solder bumps 51 to the solder bumps 70 vertically. Hence the connection media 75 are formed into the columnar shape having a height H which is longer than a width W.

Here, the circuit base members 20 and 30 and the semiconductor package 50 have different amounts of thermal expansion due to the difference in their materials. A stress attributed to the difference in the amounts of thermal expansion is applied to the connection media 75. However, the connection media 75, which are long in the height direction, have a characteristic of deforming to absorb such a stress easily. Hence, it is possible to reduce a risk of causing connection failures between the electrodes 22 and 51 due to the stress.

Moreover, there may be a case where the first circuit base member 20 or the semiconductor package 50 causes warpage due to a thermal history and the like, whereby the interval between the electrodes 22 and 52 facing each other varies depending on their positions. Even in this case, in the present embodiment, the columnar connection media 75 can absorb such variation in the interval. Therefore, it is possible to prevent the warpage of the first circuit base member 20 or the like from causing connection failure between the circuit base member 20 and the semiconductor package 50, and thereby to increase reliability of the semiconductor device.

Further, in the present embodiment, the diameter $D_1$ of the through holes 30a and 30b is formed smaller than the diameter $D_2$ of the bumps 51 and 70 as described above. Accordingly, it is possible to increase an area of the second circuit base member 30 occupied by the signal wiring 36 as compared to the case of setting the diameter $D_1$ larger than the diameter $D_2$.

Fifth Embodiment

Figure 7:
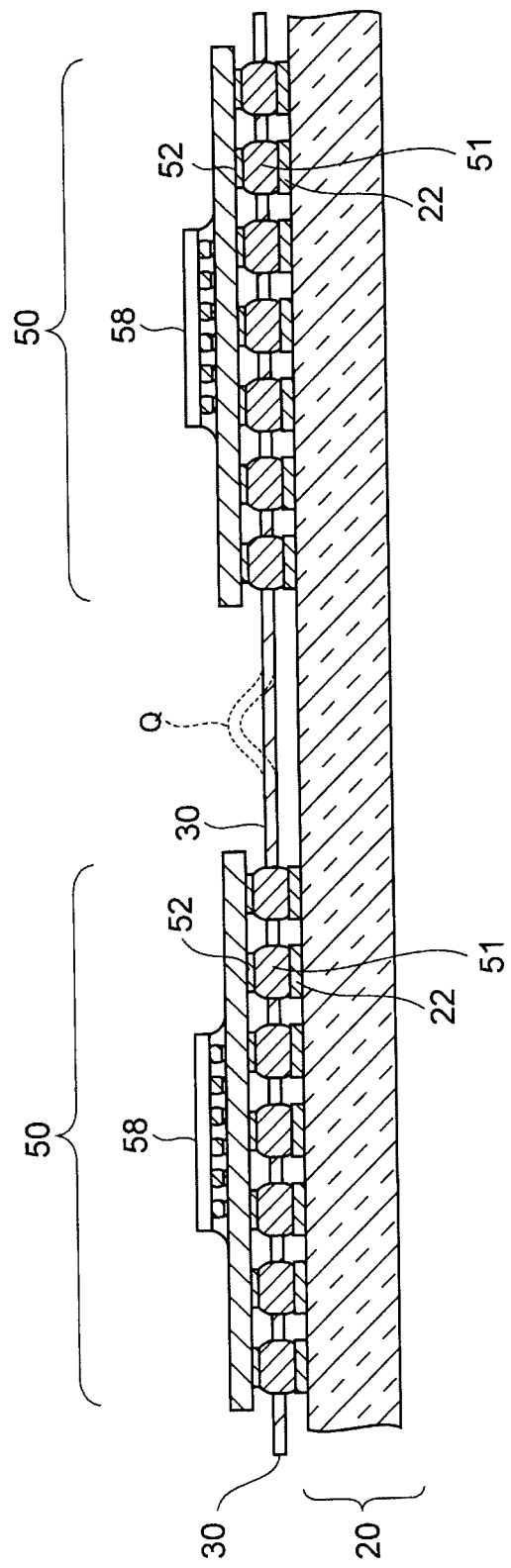
FIG. 7 is a cross-sectional view of a semiconductor device according to a fifth embodiment.

FIG. 7 is a cross-sectional view of a semiconductor device according to this embodiment. In FIG. 7, the same constituents as those described in conjunction with the first embodiment will be designated by the same reference numerals as in the first embodiment and explanation thereof will be omitted below.

In the present embodiment, as shown in FIG. 7, two semiconductor packages 50 are provided over the second circuit base member 30 side by side.

By mounting the multiple semiconductor packages 50 over the first circuit base member 20 in this manner, it is possible to achieve a higher performance of the semiconductor device as a whole as compared to the case of mounting only one semiconductor package 50.

Moreover, since the second circuit base member 30 has flexibility, it is possible to provide a margin for the alignment of the semiconductor packages 50 with the circuit base members 20 and 30 as the second circuit base member 30 can be bent as illustrated with dotted lines Q in FIG. 7.

The two semiconductor packages 50 are mounted on the first circuit base member 20 in this embodiment. However, the number of the semiconductor packages 50 is not limited only to the foregoing and it is possible to mount three or more semiconductor packages 50 thereon.

Although the present invention has been described in detail in conjunction with the embodiments, it is to be noted that the invention is not limited only to these embodiments.

For example, the semiconductor package 50 is mounted on the first circuit base member 20 in the first to fifth embodiments. However, the semiconductor component to be mounted is not limited only to the semiconductor package 50. It is also possible to apply a semiconductor element as the semiconductor component to be mounted on the first circuit base member 20.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A semiconductor device comprising:
   a first circuit base member including a surface on which a plurality of first electrodes are formed;
   a second circuit base member being provided over the first circuit base member and including a first through hole and a second through hole formed respectively over the plurality of first electrodes;
   a semiconductor component provided over the second circuit base member and including a surface on which a plurality of second electrodes are formed
   a plurality of first bumps provided in the first through hole and the second through hole and connecting the first electrodes to the second electrodes;
   a third electrode formed on the surface of the semiconductor component; and
   a wiring formed in the second circuit base member, wherein
   a recessed portion is formed in one of two principal surfaces of the second circuit base member, the one principal surface facing the semiconductor component,
   a second bump having a smaller diameter than each of the first bumps is provided in the recessed portion, and the third electrode of the semiconductor component and the wiring of the second circuit base member is connected by the second bump, and
   the second circuit base member extends laterally to the semiconductor component.

2. The semiconductor device according to claim 1, wherein the wiring is exposed on an inner surface of the second through hole and is connected to the first bump.

3. The semiconductor device according to claim 2, wherein two lines of the wiring are provided in the second circuit base member, and
   the two lines of the wiring function as a differential wiring in pair.

4. The semiconductor device according to claim 3, wherein the second circuit base member includes:
   a first insulating layer made of resin and including an upper surface on which the wiring is formed; and
   a second insulating layer made of resin and covering the wiring and the first insulating layer.

5. The semiconductor device according to claim 1, wherein the second circuit base member has flexibility.

6. The semiconductor device according to claim 5, wherein a connector is provided at an edge of the second circuit base member.

7. The semiconductor device according to claim 5, wherein a plurality of the semiconductor components are arranged over the second circuit base member side by side.

8. The semiconductor device according to claim 1, wherein an inner surface of the first through hole is isolated from the wiring by an insulating material.

9. The semiconductor device according to claim 1, further comprising:
   a fourth electrode formed on the surface of the first circuit base member, wherein
   a recessed portion is formed in one of two principal surfaces of the second circuit base member, the one principal surface facing the first circuit base member, and
   a third bump having a smaller diameter than each of the first bumps is provided in the recessed portion, and the fourth electrode of the first circuit base member and the wiring of the second circuit base member is connected by the third bump.

10. The semiconductor device according to claim 1, wherein the first bump is made of solder.

11. A semiconductor device according to claim 1,
   wherein the second circuit base member is longer than the semiconductor component in section view.

12. A semiconductor device according to claim 1,
   wherein the second circuit base member includes a laminated structure comprising the wiring, and the wiring is connected to the first bump in the second through hole.

13. A semiconductor device according to claim 1,
   wherein the inner surfaces of each of the first through hole and the second through hole are perpendicular to a principal surface of the second circuit base member.

* * * * *